US006468384B1

(12) United States Patent
Singh et al.

(10) Patent No.: US 6,468,384 B1
(45) Date of Patent: Oct. 22, 2002

(54) PREDICTIVE WAFER TEMPERATURE CONTROL SYSTEM AND METHOD

(75) Inventors: Vikram Singh, Fremont; Robert J. Whiting, Santa Clara; Paul K. Shufflebotham, San Jose; Ajay Saproo, Mountain View, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/710,083

(22) Filed: Nov. 9, 2000

(51) Int. Cl.[7] .................................................. C23F 1/00
(52) U.S. Cl. ........................... 156/345.27; 156/345.24; 118/723 E
(58) Field of Search ................................ 700/108, 123; 702/135; 361/234; 156/345; 216/60

(56) References Cited

U.S. PATENT DOCUMENTS

| 4,979,134 A | * | 12/1990 | Arima et al. ................ 702/135 |
| 5,147,498 A | * | 9/1992 | Nashimoto ................... 216/60 |
| 5,325,261 A | * | 6/1994 | Horwitz ....................... 361/234 |
| 5,444,597 A | * | 8/1995 | Blake et al. ................. 361/234 |
| 5,567,267 A | * | 10/1996 | Kazama et al. ............. 156/345 |
| 5,815,396 A | * | 9/1998 | Shimamura et al. ........ 700/123 |
| 5,818,682 A | * | 10/1998 | Loo ............................ 361/234 |
| 5,894,400 A | * | 4/1999 | Graven et al. .............. 361/234 |
| 5,956,837 A | * | 9/1999 | Shiota et al. ................. 29/559 |
| 6,275,740 B1 | * | 8/2001 | Smith, Jr. et al. ........... 700/108 |

OTHER PUBLICATIONS

Kurt A. Olson et al, "Characterization, modeling and design of an electrostatic chuck with improved wafer temperature uniformity", Rev.Sci.Inst. 66(2), 2.1995, Abstract.*

D.R. Wright et al, "Low temperature etch chuck: Modeling and experimental results of heat transfer and wafer temperature", J.Vac.Sci.Technol.A, 10(4), Jul./Aug. 1992, pp. 1065–1070.*

Smith and Corripio, "*Principles and Plactive of Automatic Process Control*", pp. 136–137, 1985, JOhn Wiley & Sons, Inc., NY, Chichester, Brisbane, Toronto, and Singapore.

* cited by examiner

*Primary Examiner*—Gregory Mills
*Assistant Examiner*—Rudy Zervigon

(57) ABSTRACT

The present invention provides plasma processing systems and methods for providing a set-point temperature for substrates during plasma processing by controlling clamping force or RF power. The plasma processing system includes a plasma chamber, a controller, and an electrostatic power supply. The plasma chamber is arranged to receive an RF power and a source gas for producing plasma. The plasma chamber includes an electrostatic chuck for clamping a substrate in place during plasma processing. The electrostatic chuck includes an electrode and a sensor, which is arranged to monitor temperature of the substrate being processed. The controller is coupled to the sensor to receive the substrate temperature and is configured to generate a control signal for driving the substrate temperature to the set-point temperature. The electrostatic power supply is coupled between the controller and the electrode in the electrostatic chuck. The electrostatic power supply receives the control signal from the controller and generates a voltage adapted to clamp the substrate with a clamping force. In this configuration, the electrostatic power supply provides the voltage to the electrode to clamp the substrate such that the substrate temperature is driven to the set-point temperature.

33 Claims, 9 Drawing Sheets

PREDICTIVE WAFER TEMPERATURE CONTROL SYSTEM AND METHOD

BACKGROUND OF THE INVENTION

1. Field of the Invention

This invention relates generally to plasma processing systems, and more particularly to plasma processing systems for maintaining a constant set-point temperature from wafer to wafer in plasma processing.

2. Description of the Related Art

High density plasma (HDP) processing systems are used to process semiconductor wafers or substrates for fabrication of integrated circuits. For example, high density plasma processes are commonly used in etching, oxidation, chemical vapor deposition (CVD), etc. The high density plasma processes are typically carried out by means of plasma processing systems and generally include a plasma processing chamber to provide a controlled setting.

FIG. 1 illustrates a schematic diagram of a conventional high density plasma processing system 100 for processing a wafer 106. The plasma processing system 100 includes a plasma processing chamber 102 and a pair of RF power generators 104A and 104B. The plasma processing chamber 102 includes an electrostatic chuck (ESC) 108 for holding and clamping the wafer 106 in place during plasma processing. The RF power generator 104A generates and provides RF power to an electrode 114 provided in the electrostatic chuck 108. An ESC power supply 122 is arranged to generate and provide a DC voltage to the electrode 114 to clamp the wafer 106 to the electrostatic chuck 108.

The plasma processing chamber 102 is configured to receive RF power from the RF power generator 104B and a source gas 116. When the RF power generators 104A and 104B are energized after the source gas 116 has been introduced into the plasma processing chamber 102, plasma 118 is generated from the source gas 116 over the wafer 106 and diffuses down to the wafer 106. In addition, the RF power provided to the electrode 114 produces ions 120 that bombard the wafer 106. In this manner, the plasma 120 and the ions 122 process the wafer 106 to produce desired plasma processing characteristics on the wafer 106.

During plasma processing, a heat transfer gas 110 such as helium is provided to the wafer 106 via a port 112 through the electrostatic chuck 112. The heat transfer gas 112 functions as a heat transfer medium between the wafer 106 and the electrostatic chuck 108 to keep the wafer 106 at a constant temperature during plasma processing. In general, this scheme keeps the wafer 106 at a reasonably constant temperature for plasma processing.

Conventional plasma processing chambers are typically used to process batches of wafers. For example, when a batch of wafers are processed, one after another, to produce integrated chips, it is desirable to keep the temperature of the wafers at a constant value. The uniformity in temperature helps to ensure fabrication of chips of uniform features across the batch of wafers.

Unfortunately, however, the conventional plasma processing system 100 often suffers from variation in wafer temperature during plasma processing from wafer to wafer due to several factors. For example, different wafers typically exhibit different resistivity, resulting in varying emissivity of RF radiation. Furthermore, the backside roughness of wafers is generally non-uniform for the wafers. On the other hand, various coatings on the front surfaces, i.e., surface being processed, of the wafers vary from wafer to wafer. In addition, different structures, devices, and materials on wafers and the aforementioned factors typically lead to varying wafer temperatures during plasma processing. As can be appreciated, the processing of wafers at such varying temperatures leads to different process performance.

In view of the foregoing, what is needed is a system and method for processing wafers at a constant temperature from wafer to wafer during plasma processing.

SUMMARY OF THE INVENTION

The present invention fills these needs by providing a system and method for providing a set-point temperature during plasma processing from substrate to substrate. It should be appreciated that the present invention can be implemented in numerous ways, including as a process, an apparatus, a system, a device, a method, or a computer readable medium. Several inventive embodiments of the present invention are described below.

In one aspect of the invention, the present invention provides a plasma processing system for providing a set-point temperature for substrates during plasma processing by controlling clamping force. The plasma processing system includes a plasma chamber, a controller, and an electrostatic power supply. The plasma chamber is arranged to receive an RF power and a source gas for producing plasma. The plasma chamber includes an electrostatic chuck for clamping a substrate in place during plasma processing. The electrostatic chuck includes an electrode and a sensor, which is arranged to monitor temperature of the substrate being processed. The controller is coupled to the sensor to receive the substrate temperature and is configured to generate a control signal for driving the substrate temperature to the set-point temperature. The electrostatic power supply is coupled between the controller and the electrode in the electrostatic chuck. The electrostatic power supply receives the control signal from the controller and generates a voltage adapted to clamp the substrate with a clamping force. In this configuration, the electrostatic power supply provides the voltage to the electrode to clamp the substrate such that the substrate temperature is driven to the set-point temperature.

In another aspect of the invention, the present invention provides a plasma processing system for providing a set-point temperature for substrates during plasma processing by controlling RF power. The plasma processing system includes a plasma chamber, an electrostatic power supply, a controller, and an RF power generator. The plasma chamber is arranged to receive a source gas for producing plasma and includes an electrostatic chuck for clamping a substrate in place during plasma processing. The electrostatic chuck includes an electrode and a sensor, which monitors the temperature of the substrate. The electrostatic power supply is coupled to the electrode to provide a voltage signal for generating a clamping force to clamp the substrate. The controller is coupled to the sensor to receive the substrate temperature and is configured to generate a control signal for driving the substrate temperature to the set-point temperature. The RF power generator is coupled between the controller and the plasma chamber. In this configuration, the RF power generator receives the control signal from the controller and generates an RF power adapted to control heat input to the substrate in response to the control signal. The RF power generator provides the RF power to the plasma chamber such that the substrate temperature is driven to the set-point temperature while generating the plasma from the source gas.

In yet another aspect of the invention, the present invention provides a method for providing a set-point temperature for substrates during plasma processing in a plasma processing system by controlling clamping force. The plasma processing system is arranged to receive an RF power and a source gas for producing plasma and includes an electrostatic chuck for clamping a substrate in place during plasma processing. The electrostatic chuck includes an electrode coupled to an electrostatic power supply to generate a clamping force for clamping the substrate. In this method, temperatures of a substrate being processed is monitored and received. In response to the monitored temperatures, a control signal is generated for driving the substrate temperature to the set-point temperature. The control signal is then provided to the electrostatic power supply to generate a clamping voltage. The clamping voltage is then provided to the electrode to generate a clamping force adapted to drive the substrate temperature to the set-point temperature.

In another aspect of the invention, a method for providing a set-point temperature for substrates during plasma processing in a plasma processing system by controlling an RF power. The plasma processing system is arranged to receive an RF power and a source gas for producing plasma and includes an electrostatic chuck for clamping a substrate in place during plasma processing. The electrostatic chuck includes an electrode coupled to an electrostatic power supply to generate a clamping force for clamping the substrate. The method includes: (a) monitoring temperatures of a substrate being processed; (b) receiving the substrate temperatures; (c) generating a control signal for driving the substrate temperature to the set-point temperature; and (d) providing the control signal to the RF power generator to generate an RF power adapted to control heat input to the substrate such that the substrate temperature is driven to the set-point temperature.

In yet another aspect of the invention, a plasma processing system for providing a set-point temperature for substrates during plasma processing is described. The plasma processing system includes a plasma chamber, a controller, and a pressure controller. The plasma chamber is arranged to receive an RF power and a source gas for producing plasma and includes an electrostatic chuck for clamping a substrate in place during plasma processing. The electrostatic chuck includes an electrode and a sensor, which is arranged to monitor temperature of the substrate. A heat transfer gas is provided under the substrate for controlling temperature of the substrate. The controller is coupled to the sensor to receive the substrate temperature and is configured to generate a control signal for driving the substrate temperature to the set-point temperature. In response to the control signal, the pressure controller is arranged to adjust the pressure of the heat transfer gas that is provided under the substrate such that the substrate temperature is driven to the set-point temperature.

In some embodiments of the present invention, the systems and methods may monitor either the rate of temperature change or emissivity change of substrates. Advantageously, the present invention minimizes temperature variation from substrate to substrate during plasma processing by providing a controlled clamping force and/or RF power input. Specifically, the present invention allows plasma processing of substrates at a specified set-point temperature from substrate to substrate by monitoring the rate of temperature or emissivity changes during plasma processing. In response to the monitored rates, a controlled clamping force is applied to the electrostatic chuck to control the heat transfer from the substrate to drive the substrate to the set-point temperature. Similarly, an RF power may be controlled to regulate heat input to the substrate to drive the substrate to the set-point temperature. By thus providing a set-point temperature for substrates, the present invention substantially improves process uniformity and yield of substrates and wafers. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

The present invention provides a system and method for providing a set-point temperature during plasma processing from substrate to substrate. It will be obvious, however, to one skilled in the art, that the present invention may be practiced without some or all of these specific details. In other instances, well known process operations have not been described in detail in order not to unnecessarily obscure the present invention.

Figure 1:
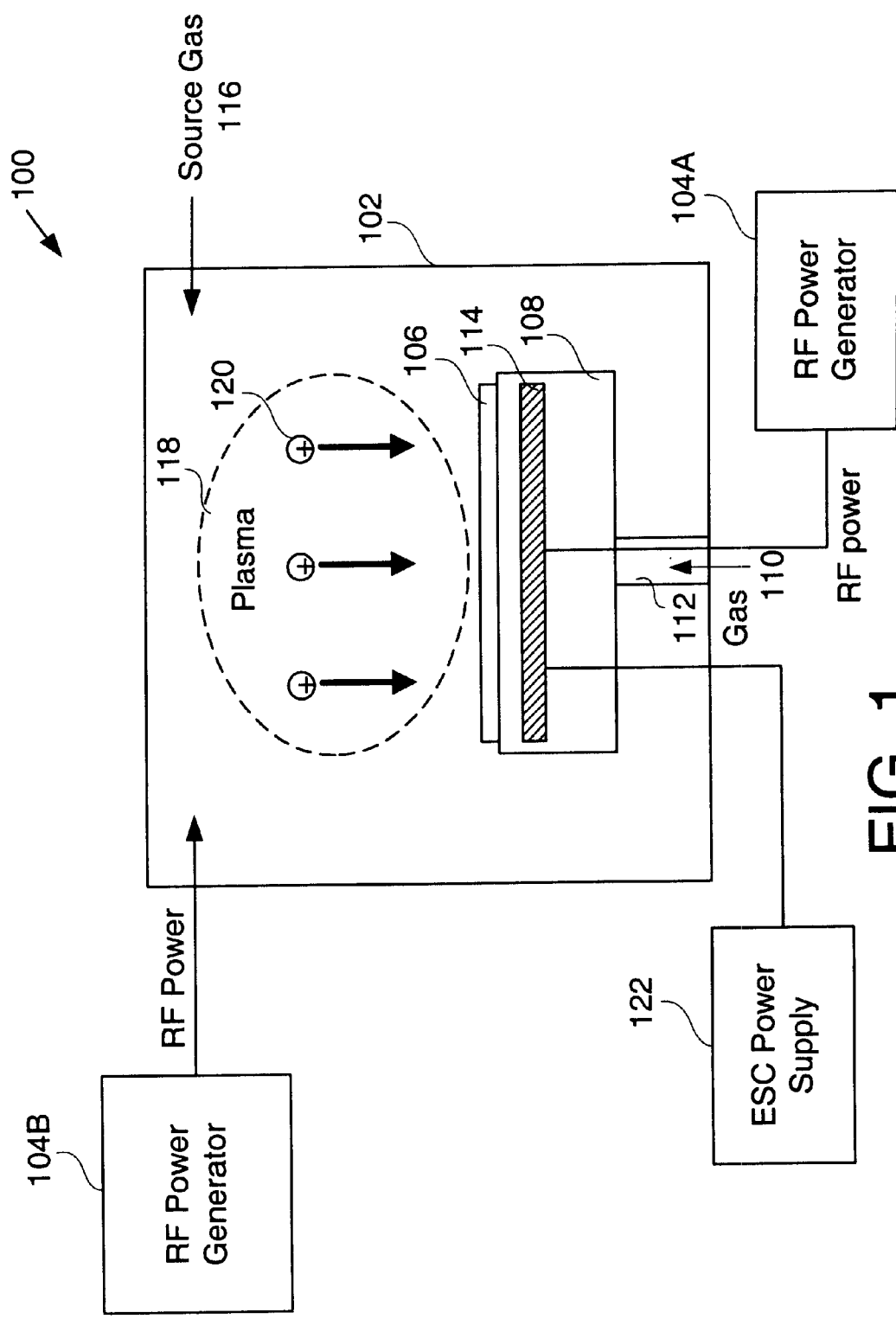
FIG. 1 illustrates a conventional high density plasma processing system for processing wafers.
Figure 2A:
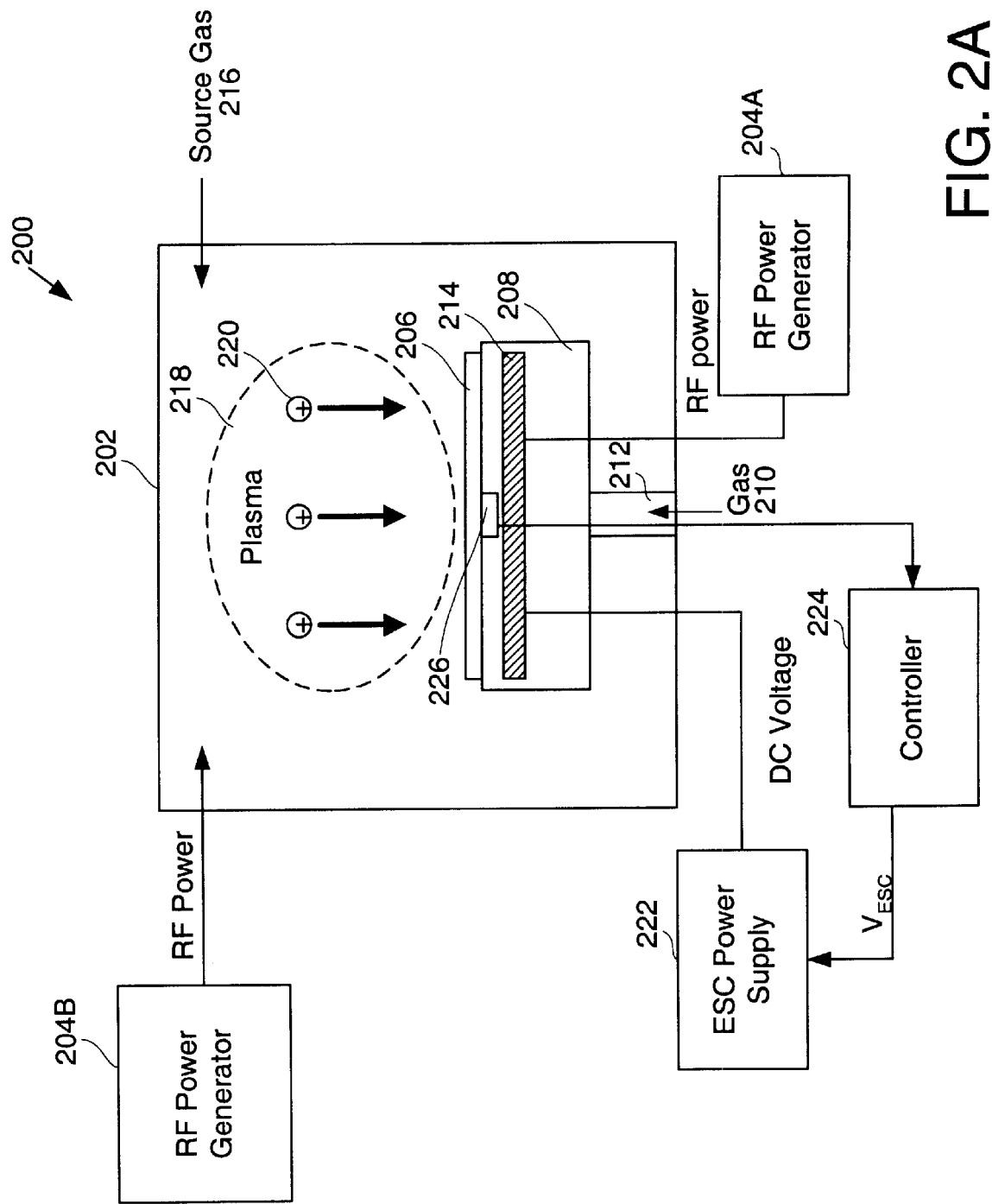
FIG. 2A illustrates a schematic diagram of a high density plasma processing system for processing one or more substrates at a set-point temperature by controlling clamping force in accordance with one embodiment of the present invention.

The present invention provides a plasma processing system and method that allow substrates to be processed at a set-point temperature from substrate to substrate. FIG. 2A illustrates a schematic diagram of a high density plasma processing system 200 for processing one or more substrates 206 at a set-point temperature by controlling clamping force in accordance with one embodiment of the present invention. As used herein, a substrate is one or more layers of material upon which one or more layers of materials may be deposited. For example, a substrate may include a wafer, flat panel display substrate, and the like, within its meaning.

The plasma processing system 200 includes a plasma processing chamber 202 and a pair of RF power generators 204A and 204B. The RF power generators 204A and 204B generate and provide RF power to the plasma processing chamber 202. The plasma processing chamber 202 includes an electrostatic chuck (ESC) 208 for holding and clamping the substrate 206 in place during plasma processing. The electrostatic chuck 208 includes an electrode 214 that is coupled to receive RF power and DC voltage from the RF power generator 204A and an ESC power supply 222, respectively. The electrode 214 generates clamping force to clamp the substrate 206 in place in response to the DC voltage from the ESC power supply 222.

The plasma processing chamber 202 is configured to receive RF power from the RF power generator 204B and a source gas 216. When the RF power generators 204A and 204B are energized after the source gas 216 has been introduced into the plasma processing chamber 202, plasma 218 is generated from the source gas 216 over the substrate 206 and diffuses down to the substrate 106. Additionally, the RF power provided to the electrode 214 produces ions 220 that bombard the substrate 206. In this manner, the plasma 218 and the ions 220 process the substrate 206 to produce desired processing characteristics.

Optionally, a heat transfer gas 210 such as helium may be provided to the substrate 206 via a port 212 through the electrostatic chuck 208. The heat transfer gas 210 functions as a heat transfer medium between the substrate 206 and the electrostatic chuck 208 to keep individual substrate at a reasonably constant temperature during plasma processing.

To provide a set-point substrate temperature to the substrate 206, the electrostatic chuck 208 includes a sensor 226 provided under the substrate 206 to monitor substrate condition. The sensor may be implemented using conventional temperature sensors such as infra-red pyrometer. In one embodiment, the sensor 226 is arranged to measure or detect the temperature of the substrate 206. In another embodiment, the sensor 226 measures the emissivity of radiation from the substrate 206 using, for example, conventional reflectivity technique.

A controller 224 is coupled to receive the measured signal (e.g., temperature or emissivity) of the substrate 206 from the sensor 226. In response to the received measurement, the controller 224 determines a clamping force needed to produce a set-point temperature at which to process the substrate 206. The clamping force to be applied to the electrostatic chuck 208 is generated by applying a DC voltage, $V_{ESC}$, which is proportional to the clamping force. In turn, the clamping force is proportional to heat transfer from substrate 206 to the electrostatic chuck 208. Thus, a higher clamping force will produce higher heat transfer from substrate to ESC, thereby leading to lower substrate temperature. Conversely, a lower clamping force produces lower heat transfer from substrate to ESC, resulting in higher substrate temperature.

The controller 224 determines a clamping force and corresponding DC voltage needed to produce a desired set-point substrate temperature. The controller 224 provides a DC voltage signal $V_{ESC}$, which is required to generate a clamping force needed for attaining the set-point temperature for the substrate 206, to the ESC power supply 222. In response, the ESC power supply 222 generates and provides the DC voltage to the electrode 214 in the electrostatic chuck 208. In one embodiment, the controller 224 computes an error signal, E(t), which is the difference between the substrate temperature set-point and the measured substrate temperature value. The controller 224 uses error signal E(t) in a feedback loop until the substrate reaches the desired set-point temperature.

Figure 2B:
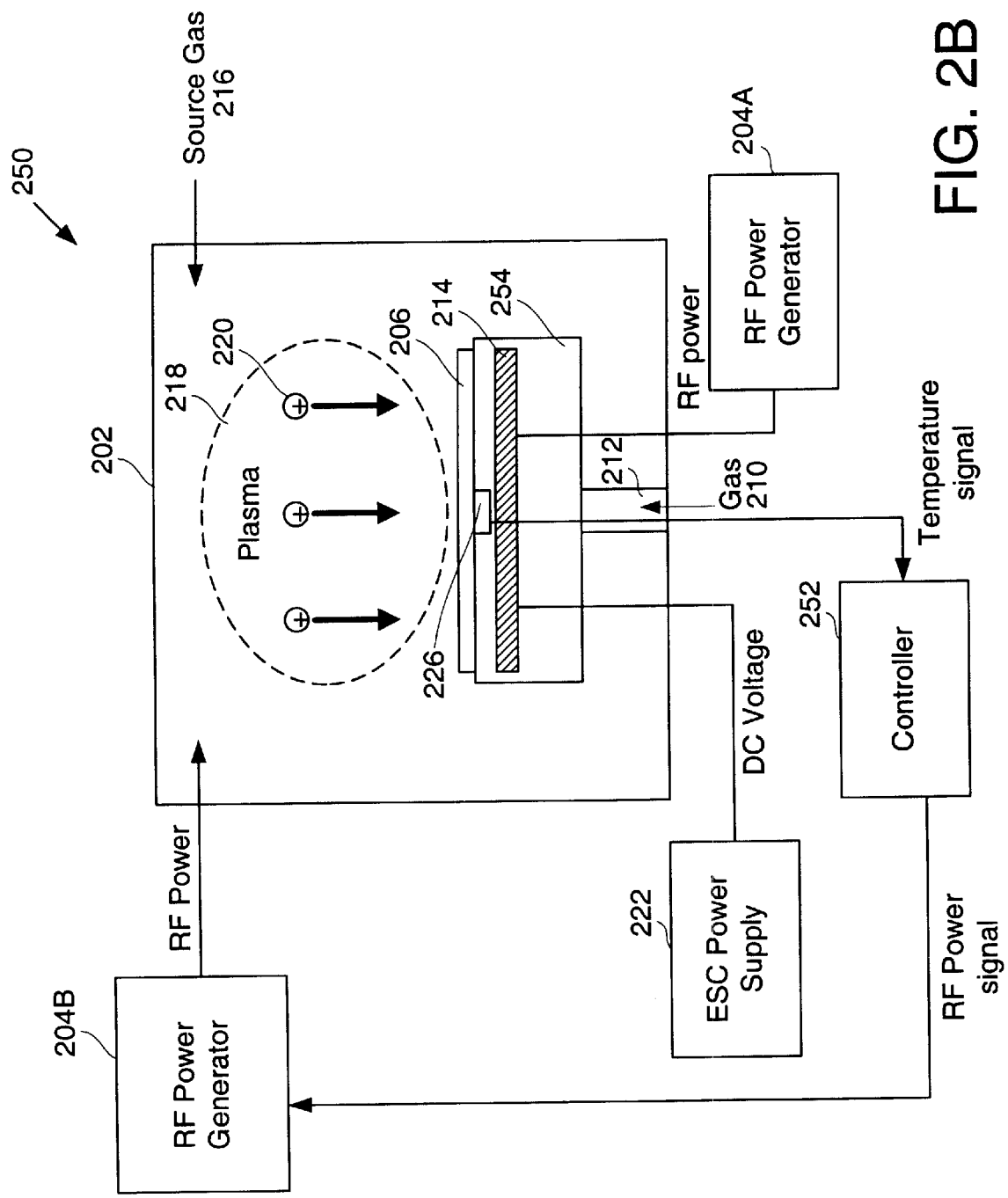
FIG. 2B illustrates a schematic diagram of a high density plasma processing system for processing one or more substrates at a set-point temperature by controlling RF power input in accordance with another embodiment of the present invention.

In another embodiment, the controller 224, instead of controlling the clamping force, may be configured to control RF power input into the plasma processing chamber 202. For example, FIG. 2B illustrates a schematic diagram of a high density plasma processing system 250 for processing one or more substrates 206 at a set-point temperature by controlling RF power input in accordance with another embodiment of the present invention. The plasma processing system 250 is similar to and operates in a similar manner as the system 200 described above and shown in FIG. 2A. It is noted that the plasma processing chamber 202 includes a pedestal 254 configured to support the substrate 206 for plasma processing. The pedestal 254 may be implemented using any suitable conventional devices for supporting the substrate 206 and is not limited to electrostatic chucks.

In contrast to controller 224 of FIG. 2A, however, a controller 252 in the plasma processing system 250 is arranged to determine and output an RF power designed to produce the set-point substrate temperature by controlling the heat input of the RF power into the plasma processing chamber 202. Specifically, the controller 252 is coupled to receive the measured signal (e.g., temperature or emissivity) of the substrate 206 from the sensor 226. Based on the received signal, the controller 252 provides an RF power signal for generating an RF power needed for attaining the set-point temperature for the substrate 206, to the RF power generator 204B. In response, the RF power generator 204B generates and provides the RF power to the plasma processing chamber 202. In this configuration, a higher RF power will provide higher heat input to the substrate 206, thereby leading to higher substrate temperature. Conversely, a lower RF power produces lower heat input to the substrate 206, resulting in lower substrate temperature.

Figure 2C:
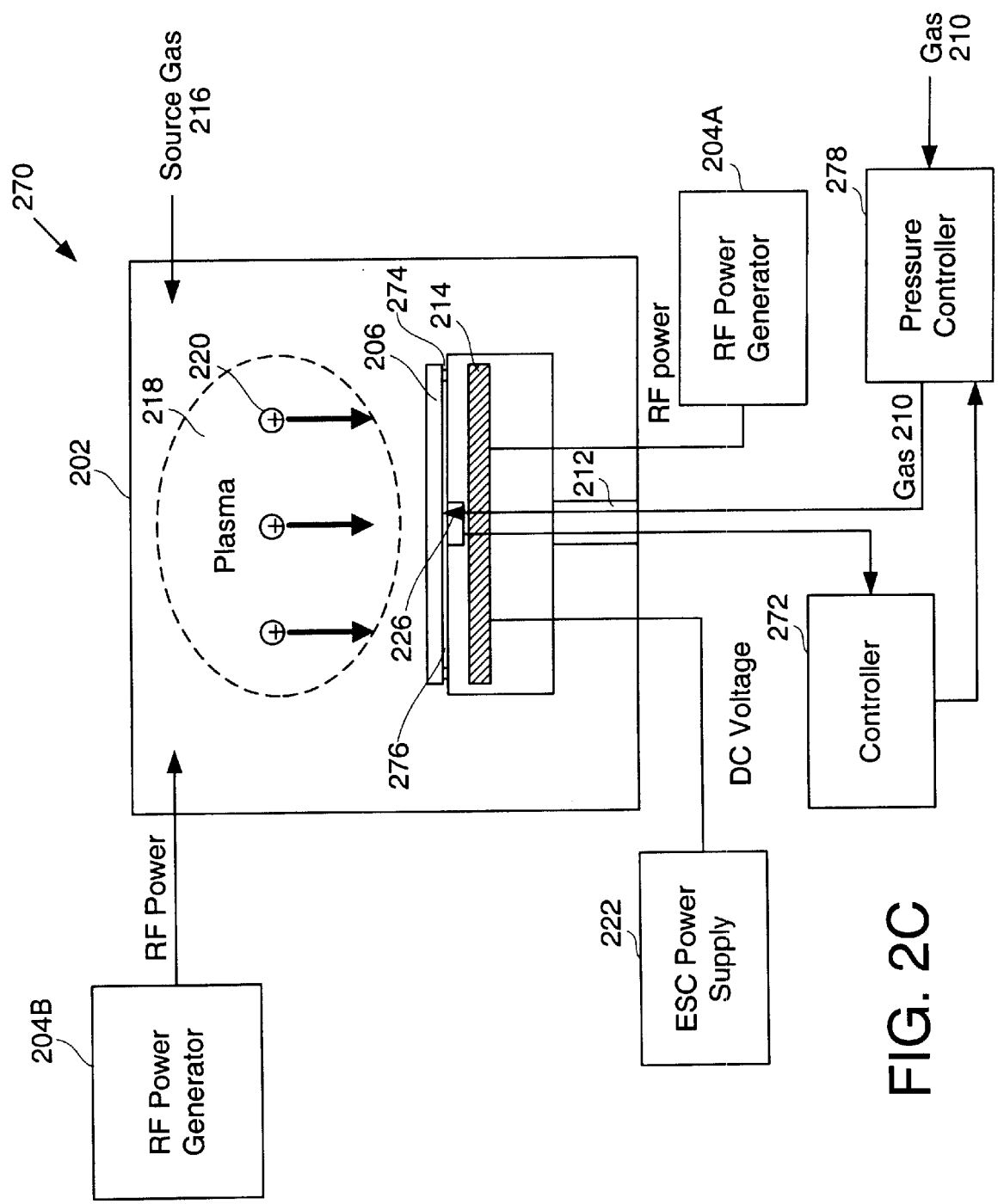
FIG. 2C shows a schematic diagram of a high density plasma processing system for processing one or more substrates at a set-point temperature by controlling helium pressure in accordance with one embodiment of the present invention.

In another embodiment, the pressure of the heat transfer gas 210 such as helium may be controlled to drive the substrate temperature to a set-point temperature. For example, FIG. 2C shows a schematic diagram of a high density plasma processing system 270 for processing one or more substrates at a set-point temperature by controlling helium pressure in accordance with one embodiment of the present invention. The basic functions and operations of the plasma processing system 270 is similar to the systems 200 and 250 shown in FIGS. 2A and 2B. In FIG. 2C, a seal 124 (e.g., lip) is provided near the edge of the substrate 206 to seal or contain the heat transfer gas 206 within a region 276 under the substrate 206.

However, in contrast to controllers 224 and 252 of FIGS. 2A and 2B, a controller 272 in the plasma processing system 270 is arranged to determine and output a pressure signal designed to produce the set-point substrate temperature. The controller 272 is coupled to receive the measured signal (e.g., temperature or emissivity) of the substrate 206 from the sensor 226. Based on the received signal, the controller 272 provides a pressure signal to the pressure controller 278 that is arranged to control the pressure of the heat transfer gas 210 under the substrate 206 in response. Specifically, the pressure controller 278 receives the heat transfer gas 210 and provides the gas 210 with the pressure specified by the controller 272. Controlling the pressure under the substrate 206 in this manner in response to measured temperature allows the substrate temperature to be driven to the set-point temperature.

Figure 3A:
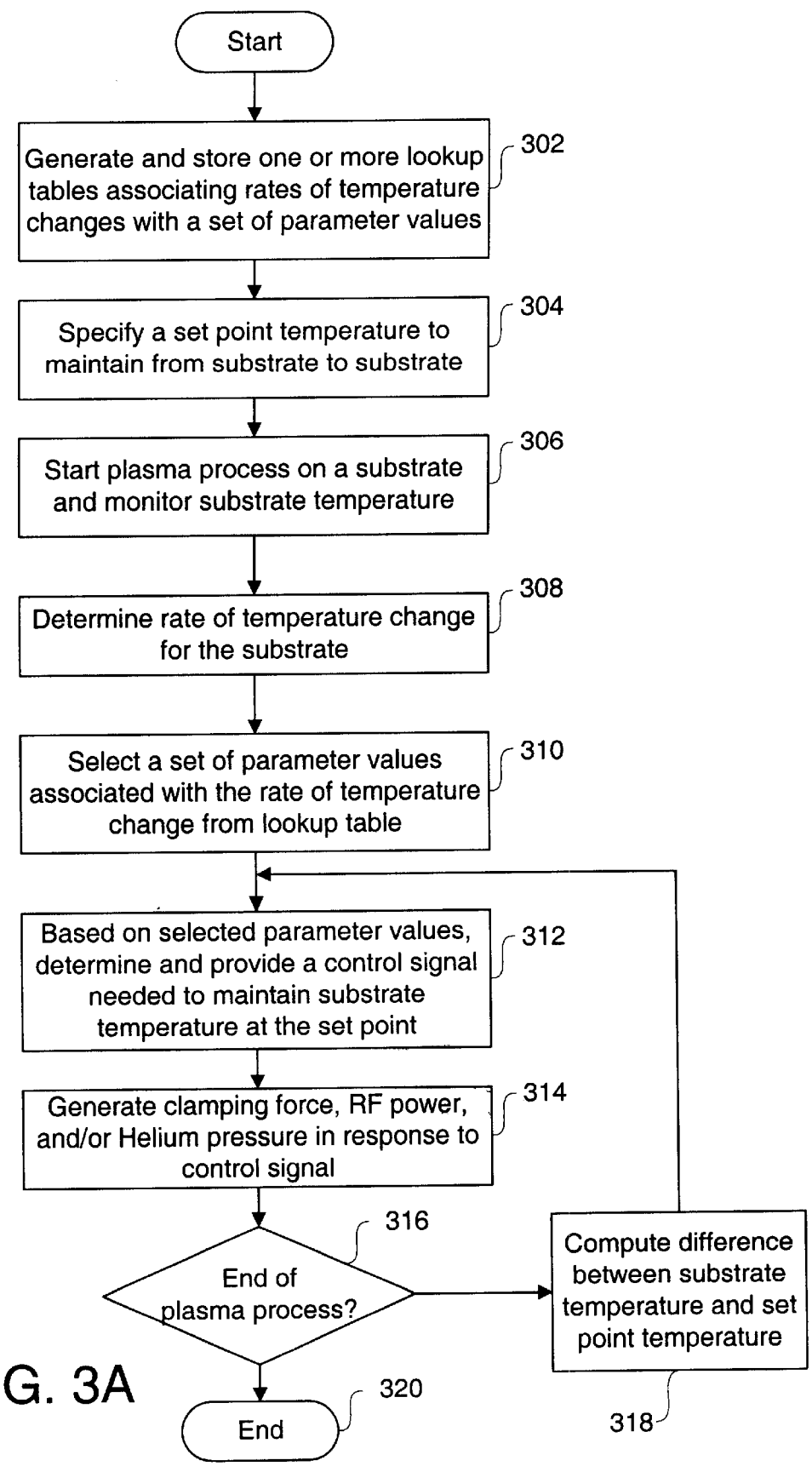
FIG. 3A shows a flowchart of an exemplary method performed by a plasma processing system based on a rate of temperature changes in accordance with one embodiment of the present invention.

FIG. 3A shows a flowchart of an exemplary method performed by a plasma processing system based on a rate of temperature changes in accordance with one embodiment of the present invention. In this method, one or more lookup tables associating a set of rates of temperature change and a set of parameters are generated and stored in operation 302. In one embodiment, the set of parameters may be defined by the following equation:

$$M(t)=Mc+Kp*E(t)+1/\Gamma i \int E(t)dt+\Gamma d*d\{E(t)\}/dt \qquad \text{Equation (1)}$$

where M(t)=output from controller at a given time;
  Mc=bias value, pre-programed constant ESC voltage depending on the rate of rise of substrate temperature, based on substrate emissivity;
  Kp=proportional gain;
  $\Gamma i$=integral constant;
  $\Gamma d$=derivative constant; and
  E(t)=error signal, difference between the substrate temperature set-point and the measured substrate temperature value. Equation (1) is well known in the art and is described, for example, on pages 158–168 in *Principles and Practice of Automatic Process Control* by Carlos A. Smith and Armando B. Corripio (1985), which is incorporated herein by reference in its entirety. Using Equation (1), values of four parameters Kp, $\Gamma i$, $\Gamma d$, and E(t) are determined for a range of temperature change rates and stored in a lookup table in one embodiment.

After one or more lookup tables have been generated and stored, a set-point temperature for one or more substrates is specified in operation 304. The set-point temperature is the desired temperature at which to process the substrates and may range, for example, between 50 to 700° C. Then, the plasma process is started on a substrate in the plasma processing chamber 202 and the substrate temperature is monitored in operation 306 using sensor 226. Based on the measured temperatures, the rate of temperature change is determined in operation 308. For example, the rate of temperature change may be computed by taking two temperatures and dividing the temperature difference by the difference in time.

Once a rate of temperature change has been determined, a set of parameter values associated with the rate of temperature change is selected from the lookup table in operation 310. Then, in operation 312, the controller 224 generates a control signal M(t) needed to maintain substrate temperature at the set-point based on the selected parameter values. For example, the signal M(t) may be determined using the parameter values in the above mentioned Equation (1). In one embodiment, the signal is a DC voltage signal applied to the ESC power supply 222 and indicates a clamping force to be applied to the substrate via ESC 208. In an alternative embodiment, the signal is an RF power signal provided to the RF power generator 204B to generate an RF power for input to the plasma processing chamber.

In response to the control signal M(t), a clamping force is generated via ESC power supply 222 in operation 314. In this case, the DC voltage generated by the ESC power supply 222 may range up to 2,500 volts. Alternatively, the RF power generator 204B generates RF power of up to 10 KWatt in response to the control signal M(t). Also, the pressure of the heat transfer gas (e.g., helium) provided under the substrate may be controlled. In these cases, the clamping force, the RF power, or the gas pressure operates to drive the temperature of the substrate toward the set-point temperature. It should be noted that the controller may also use any combination of the clamping force, RF power, and gas pressure to drive the substrate temperature to the set-point.

Then, in operation 316, it is determined whether the plasma process has been completed for the substrate. If the process has not been completed, the method proceeds to operation 318, where the E(t), which is the difference between the substrate temperature and the set-point temperature, is determined. The value of E(t) is then provided, in operation 312, to determine a new signal M(t) needed to drive the substrate temperature to the set-point temperature. On the other hand, if the process has been completed for the substrate, then the method terminates in operation 320. Additional substrates may also be processed at the set-point temperature using the method described above.

Figure 3B:
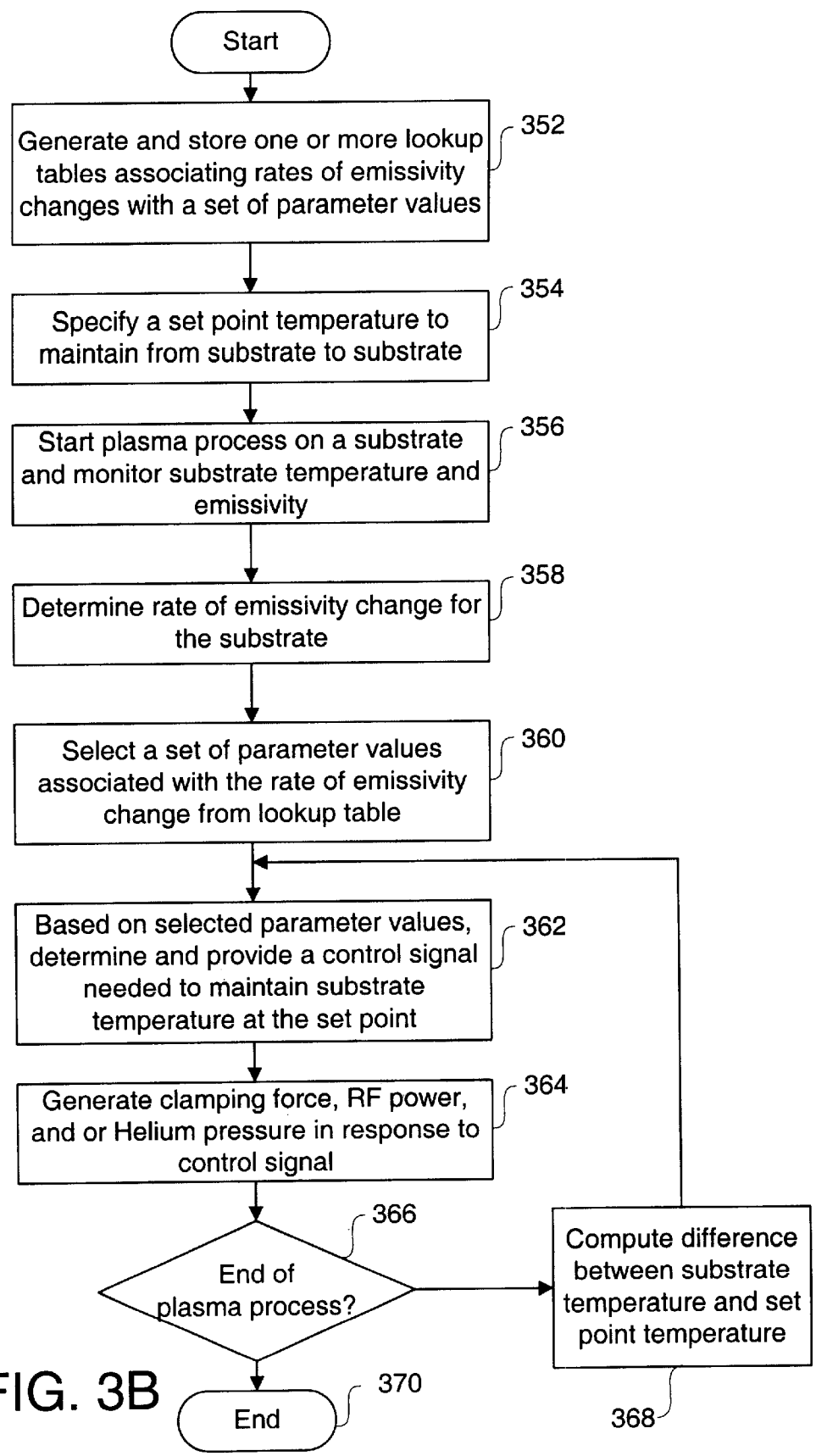
FIG. 3B shows a flowchart of an exemplary method performed by a plasma processing system based on a rate of emissivity changes in accordance with another embodiment of the present invention.

In another embodiment, FIG. 3B shows a flowchart of an exemplary method performed by a plasma processing system based on rates of emissivity changes. This method is similar to the method shown in FIG. 3A except that rate of emissivity changes is used instead of the rate temperature changes. For example, in operation 352, one or more lookup tables associating a set of rates of emissivity changes and a set of parameters are generated and stored. In addition, after the plasma process is started on a substrate in the plasma processing chamber 202, the substrate temperature and emissivity are monitored in operation 356 using the sensor 226. Based on the measured temperatures, the rate of emissivity change is determined in operation 358. Once a rate of emissivity change has been determined, a set of parameter values associated with the rate of emissivity change is selected from the lookup table in operation 360. Other operations proceed in a similar manner as described above in conjunction with FIG. 3A.

Figure 4:
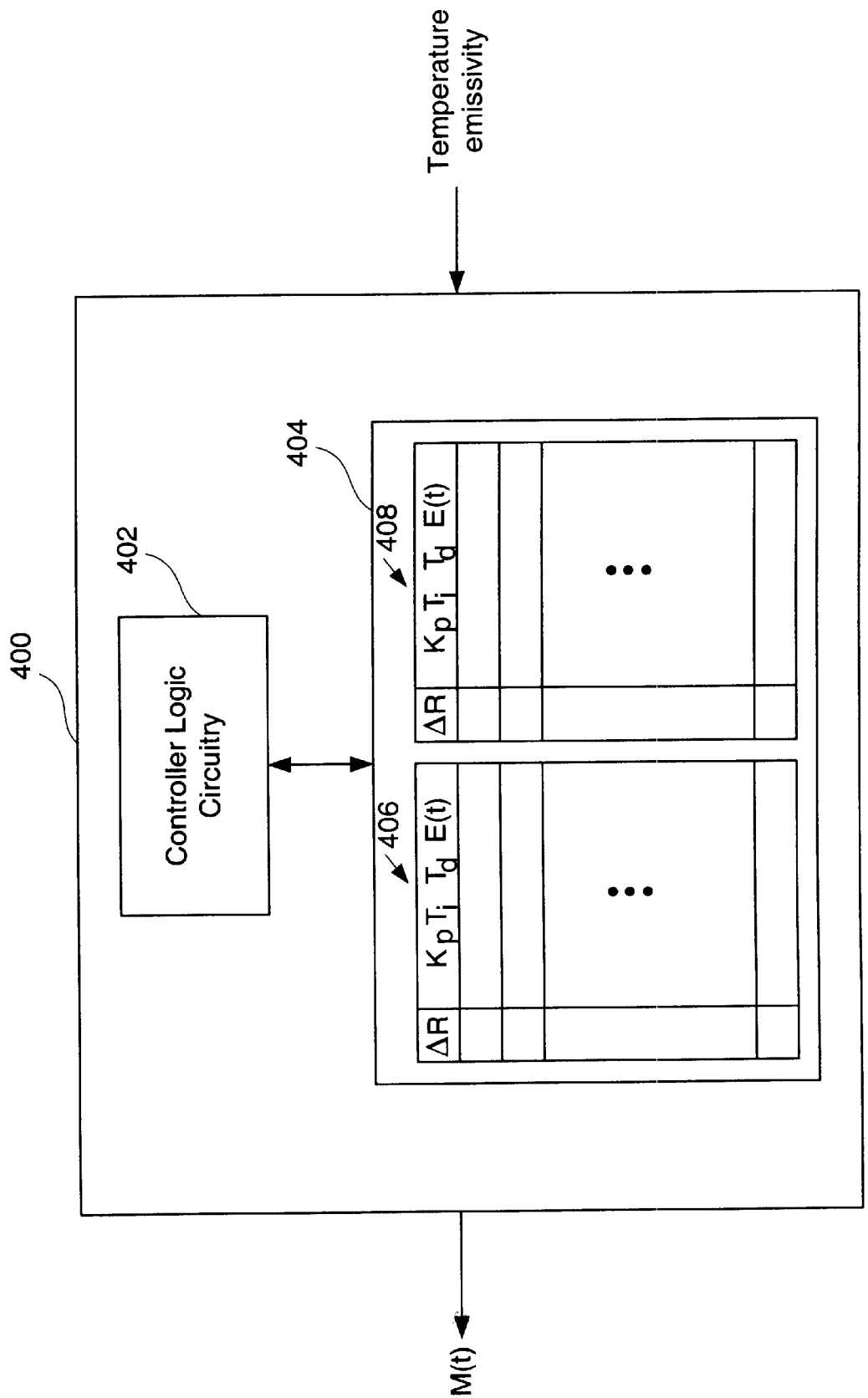
FIG. 4 shows a more detailed block diagram of a controller for generating a control signal in accordance with one embodiment of the present invention.

FIG. 4 shows a more detailed block diagram of a controller 400 in accordance with one embodiment of the present invention. The controller 400 includes a controller logic circuitry 402 and a storage device 404. The storage device 404 is configured to store a set of lookup tables 406 and 408 and may be implemented using any suitable storage devices such as RAM, ROM, hard disk drive, etc. In one embodiment, the lookup. table 406 stores a set of rates of temperature changes, $\Delta R$, and associated parameter values corresponding to Kp, $\Gamma i$, $\Gamma d$, and E(t) of Equation (1). Similarly, the lookup table 408 may store a set of rates of emissivity changes and associated parameter values corresponding to Kp, $\Gamma i$, $\Gamma d$, and E(t) of Equation (1).

The controller logic circuitry 402 accesses a selected lookup table 406 or 408 and computes M(t), which may be either $V_{ESC}$ or RF power. The system response to the controller is conventional "First Order with Dead Time," with the substrate transparency contributing to the apparent dead time characteristics. In a preferred embodiment, the controller logic circuitry 402 is implemented to allow for either running the plasma processing system in open loop or closed loop mode. For example, in the open loop mode, the controller 400 passes on the pre-specified ESC voltage value to the ESC power supply. In the closed loop mode, the controller action is initiated when the pre-heat end-point is achieved and a temperature set-point is received. At this time, the ESC power supply is also enabled.

Both feedforward and feedback characteristics are built into the controller logic circuitry 402. The feedforward feature is achieved by monitoring the slope of substrate temperature with time right after a global minima is obtained. The controller 400 may also implement different feedback control action for high and low resistivity substrates, which typically heat up at different rates. In one embodiment, two bins are specified for substrate types: one that heats up at rates greater than 7° C./sec and one that heats up at rates lower than 7° C./sec. In such cases, lookup table 406 may be used to store data for the former bin while lookup table 408 may be used to store data for the latter bin. The controller 400 may also accommodate additional bins as needed.

Figure 5:
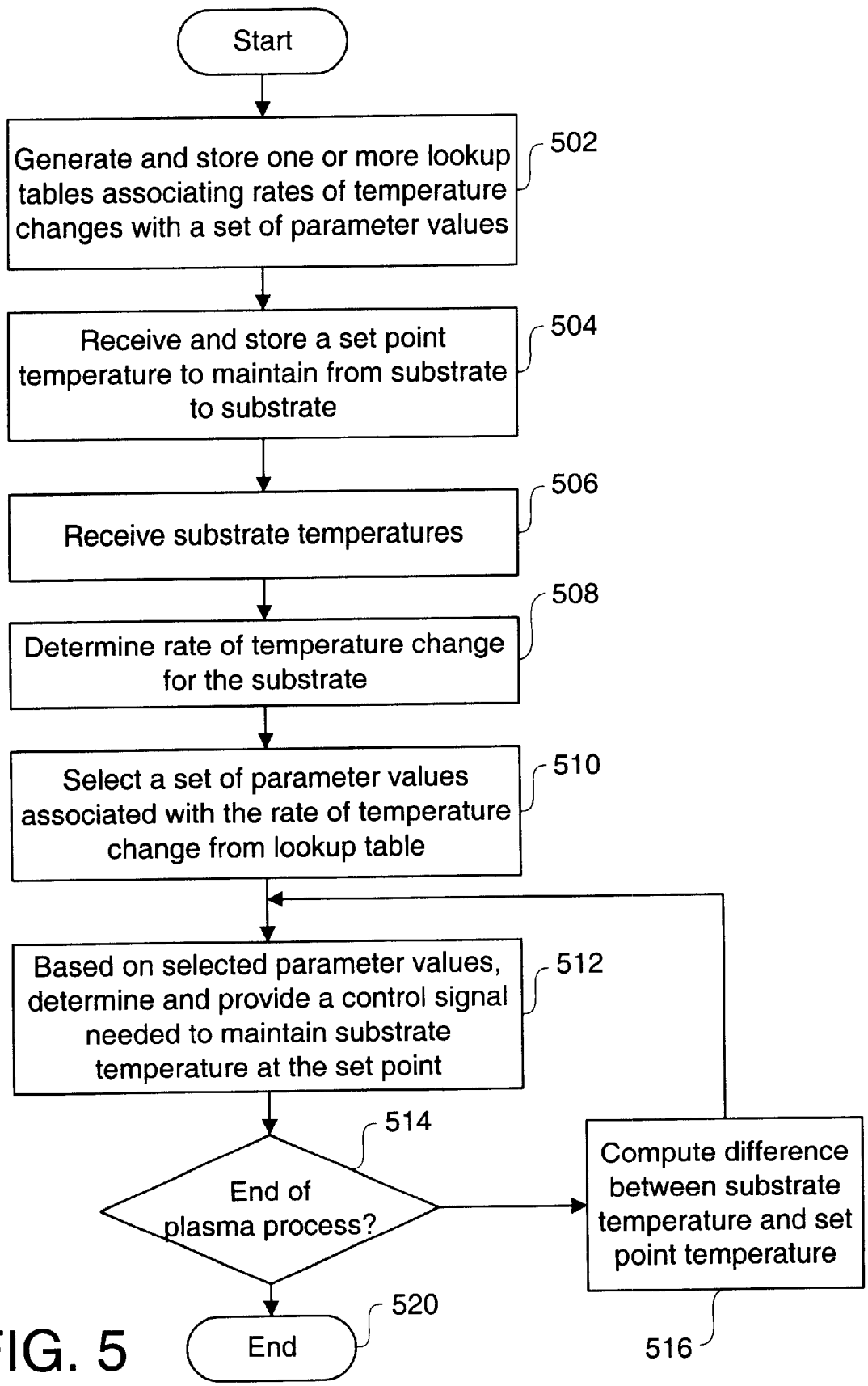
FIG. 5 shows a flowchart of a method performed by the controller for generating a control signal M(t) for controlling the substrate temperature in accordance with one embodiment of the present invention.

FIG. 5 shows a flowchart of a method performed by the controller 400 for generating a control signal M(t) for controlling the substrate temperature in accordance with one embodiment of the present invention. It should be borne in mind that this method may also be applied by using rate of emissivity changes in lieu of temperature changes. In this method, one or more lookup tables associating a set of temperature change rates with a set of parameter values are stored in operation 502 in the storage device 404. The controller 400 then receives and stores a set-point temperature for substrates in operation 504.

After plasma process has started, the controller 400 receives substrate temperatures in operation 506 and determines a rate of temperature change for the substrate in operation 508. The controller 400 then selects a set of parameter values associated with the determined rate of temperature change from a lookup table in operation 510. Based on the selected parameter values, the controller 400 evaluates a control signal M(t) by using Equation (1) in operation 512. Then, in operation 514, the controller 400 determines whether the plasma process has been completed for the substrate. If the process has not been completed, the method proceeds to operation 516, where deviation value E(t), which is the difference between the substrate temperature and the set-point temperature, is determined. The new value of E(t) is then used in operation 512, to determine a new signal M(t) needed to drive the substrate temperature to the set-point temperature. However, if the process has been completed for the substrate, the method terminates in operation 520.

Figure 6:
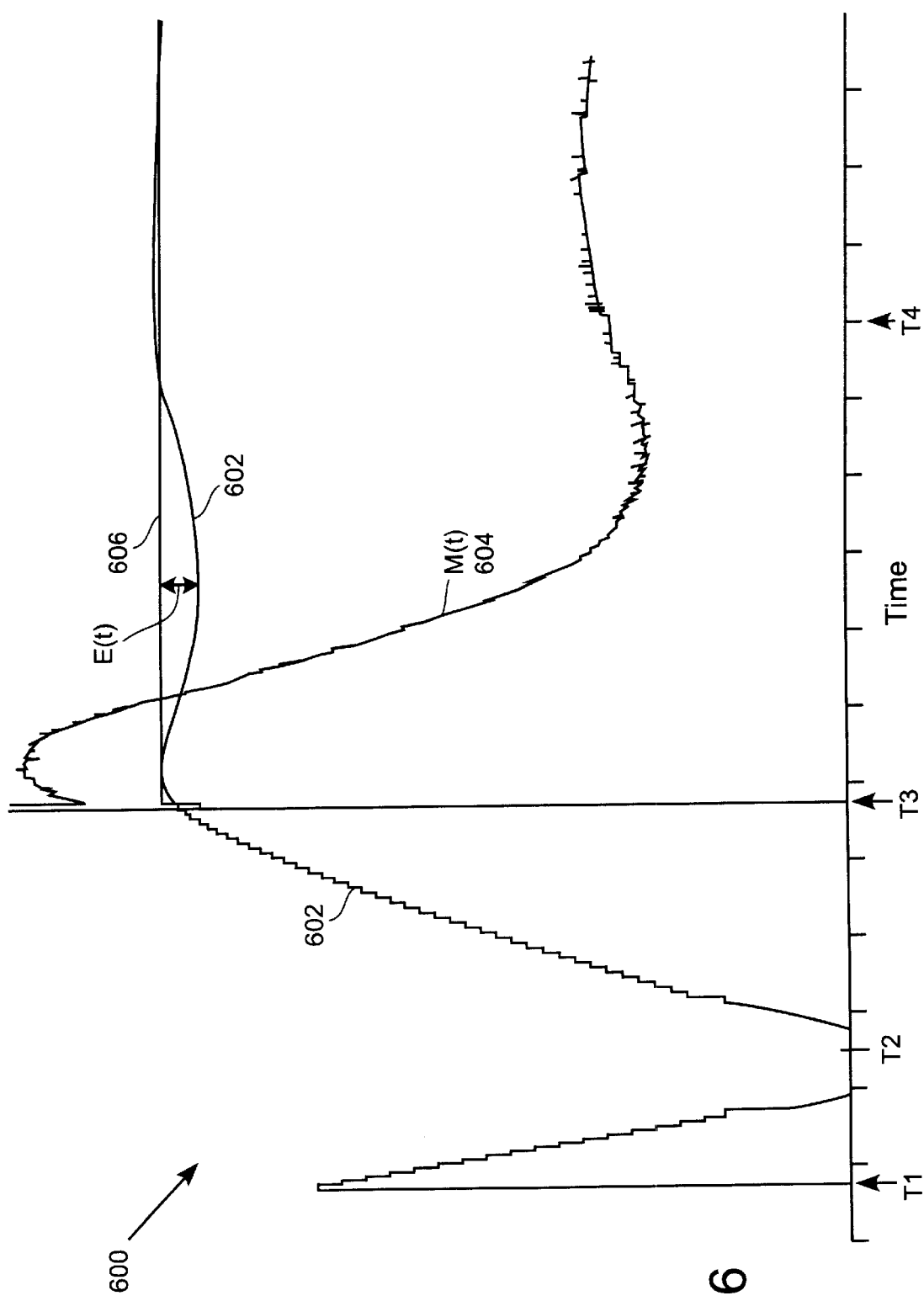
FIG. 6 is a graph showing how the substrate temperature reaches a set-point temperature in response to a control signal M(t) in accordance with one embodiment of the present invention.

FIG. 6 is a graph 600 showing how the substrate temperature 602 reaches a set-point temperature 606 in response to a control signal M(t) in accordance with one embodiment of the present invention. When, the substrate temperature exhibits dead time characteristics from time T1 until time T2 when the plasma process is started. Then, the substrate temperature rises until time T3, at which time the control signal M(t) of clamping force and/or RF power is provided to drive the substrate temperature 602 to the set-point temperature 606. The controller 400 monitors signal E(t), which is the difference between the set-point temperature and the substrate temperature, to produce M(t), thereby driving the substrate temperature 602 to the set-point temperature 606 at about time T4.

Thus, the present invention allows plasma processing of substrates at a specified set-point temperature from substrate to substrate by monitoring the rate of temperature or emissivity changes during plasma processing. For example, in response to the monitored rates, the controlled clamping force is applied to the electrostatic chuck to control the heat transfer from the substrate to drive the substrate to the set-point temperature. Similarly, an RF power is controlled to regulate heat input to the substrate to drive the substrate to the set-point temperature. The present invention thus minimizes temperature variation from substrate to substrate during plasma processing by providing a controlled clamping force and/or RF power input. In turn, the processing of substrates at a set-point temperature substantially improves process uniformity and yield of substrates and wafers, resulting in significant savings in cost.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing system for providing a set-point temperature for substrates during plasma processing, comprising:

a plasma chamber arranged to receive an RF power and a source gas for producing plasma, the plasma chamber including an electrostatic chuck for clamping a substrate in place during plasma processing, the electrostatic chuck including an electrode and a sensor, the sensor being arranged to monitor temperature of the substrate;

a controller coupled to the sensor to receive the substrate temperature, the controller generating a control signal for driving the substrate temperature to the set-point temperature; and an electrostatic power supply coupled between the controller and the electrode in the electrostatic chuck, the electrostatic power supply receiving the control signal from the controller and generating a voltage adapted to clamp the substrate with a clamping force, wherein the electrostatic power supply provides the voltage to the electrode to clamp the substrate such that the substrate temperature is driven to the set-point temperature;

wherein the controller generates the control signal by determining the rate of temperature change for the substrate, and stores one or more lookup tables, each lookup table associating rates of temperature changes and a plurality of parameter values with one rate of temperature change being associated with a set of parameter values, wherein the controller selects a set of parameter values associated with the determined rate of temperature change and generates the control signal.

2. The plasma processing system as recited in claim 1, wherein the control signal indicates a clamping force to be applied to the substrate.

3. The plasma processing system as recited in claim 1, wherein the control signal is M(t) and wherein the controller generates the control signal M(t) in accordance with an equation, $M(t)=Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

4. The plasma processing system as recited in claim 3, wherein the set of parameter values in the one or more lookup tables include values for Kp, $\Gamma i$, $\Gamma d$, and E(t).

5. The plasma processing system as recited in claim 1, wherein the sensor is further arranged to monitor emissivity of the substrate and provide an emissivity signal to the controller, wherein the controller generates the control signal in response to a rate of emissivity change for the substrate.

6. The plasma processing system as recited in claim 5, wherein the control signal indicates a clamping force to be applied to the electrostatic chuck of the plasma chamber.

7. The plasma processing system as recited in claim 6, wherein the controller stores one or more lookup tables, each lookup table associating rates of emissivity changes and a plurality of parameter values with one rate of emissivity change being associated with a set of parameter values, wherein the controller selects a set of parameter values associated with the determined rate of emissivity change and generates the control signal.

8. The plasma processing system as recited in claim 7, wherein the control signal is M(t) and wherein the controller generates the control signal M(t) in accordance with an equation, $M(t) = Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

9. The plasma processing system as recited in claim 8, wherein the set of parameter values in the one or more lookup tables include values for Kp, $\Gamma i$, $\Gamma d$, and E(t).

10. The plasma processing system as recited in claim 1, wherein the substrate is a wafer.

11. A plasma processing system for providing a set-point temperature for substrates during plasma processing, comprising:
   a plasma chamber arranged to receive a source gas for producing plasma, the plasma chamber including a pedestal for supporting a substrate in place during plasma processing, the pedestal including an electrode and a sensor, the sensor being arranged to monitor temperature of the substrate;
   a controller coupled to the sensor to receive the substrate temperature, the controller generating a control signal for driving the substrate temperature to the set-point temperature;
   an RF power generator coupled between the controller and the plasma chamber, the RF power generator receiving the control signal from the controller and generating an RF power adapted to control heat input to the substrate in response to the control signal, wherein the RF power generator provides the RF power to the plasma chamber such that the substrate temperature is driven to the set-point temperature while generating the plasma from the source gas;
   wherein the controller stores one or more lookup tables, each lookup table associating rates of temperature changes and a plurality of parameter values with one rate of temperature change being associated with a set of parameter values, wherein the controller selects a set of parameter values associated with the determined rate of temperature change and generates the control signal.

12. The plasma processing system as recited in claim 11, wherein the pedestal is an electrostatic chuck for clamping the substrate and wherein an electrostatic power supply is coupled to the electrode to provide a voltage signal for generating a clamping force to clamp the substrate.

13. The plasma processing system as recited in claim 11, wherein the control signal indicates an RF power to be applied to the plasma chamber.

14. The plasma processing system as recited in claim 11, wherein the controller generates the control signal by determining the rate of temperature change for the substrate.

15. The plasma processing system as recited in claim 11, wherein the control signal is M(t) and wherein the controller generates the control signal M(t) in accordance with an equation, $M(t) = Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

16. The plasma processing system as recited in claim 15, wherein the set of parameter values in the one or more lookup tables include values for Kp, $\Gamma i$, $\Gamma d$, and E(t).

17. The plasma processing system as recited in claim 11, wherein the sensor is further arranged to monitor emissivity of the substrate and provide an emissivity signal to the controller, wherein the controller generates the control signal in response to a rate of emissivity change for the substrate.

18. The plasma processing system as recited in claim 17, wherein the control signal indicates an RF power to be provided to the plasma chamber.

19. The plasma processing system as recited in claim 18, wherein the controller stores one or more lookup tables, each lookup table associating rates of emissivity changes and a plurality of parameter values with one rate of emissivity change being associated with a set of parameter values, wherein the controller selects a set of parameter values associated with the determined rate of emissivity change and generates the control signal.

20. The plasma processing system as recited in claim 19, wherein the control signal is M(t) and wherein the controller generates the control signal M(t) in accordance with an equation, $M(t) = Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

21. The plasma processing system as recited in claim 20, wherein the set of parameter values in the one or more lookup tables include values for Kp, $\Gamma i$, $\Gamma d$, and E(t).

22. The plasma processing system as recited in claim 13, wherein the substrate is a wafer.

23. A plasma processing system for providing a set-point temperature substrates during plasma processing, comprising:
   a plasma chamber arranged to receive an RF power and a source gas for producing plasma, the plasma chamber including an electrostatic chuck for clamping a substrate in place during plasma processing, the electrostatic chuck including an electrode and a sensor, the sensor being arranged to monitor temperature of the substrate, wherein a heat transfer gas is provided under the substrate for controlling temperature of the substrate;
   a controller coupled to the sensor to receive the substrate temperature, the controller generating a control signal for driving the substrate temperature to the set-point temperature; and
   a pressure controller coupled to receive the control signal and being arranged to adjust the pressure of the heat transfer gas that is provided under the substrate such that the substrate temperature is driven to the set-point temperature;
   wherein the controller generates the control signal by determining the rate of temperature change for the substrate and stores one or more lookup tables, each lookup table associating rates of temperature changes and a plurality of parameter values with one rate of temperature change being associated with a set of parameter values, wherein the controller selects a set of parameter values associated with the determined rate of temperature change and generates the control signal.

24. The plasma processing system as recited in claim 23, wherein the heat transfer gas is helium.

25. The plasma processing system as recited in claim 24, wherein the control signal indicates the gas pressure to be applied under the substrate.

26. The plasma processing system as recited in claim 23, wherein the control signal is M(t) and wherein the controller generates the control signal M(t) in accordance with an equation, $M(t)=Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

27. The plasma processing system as recited in claim 26, wherein the set of parameter values in the one or more lookup tables include values for Kp, $\Gamma i$, $\Gamma d$, and E(t).

28. The plasma processing system as recited in claim 24, wherein the sensor is further arranged to monitor emissivity of the substrate and provide an emissivity signal to the controller, wherein the controller generates the control signal in response to a rate of emissivity change for the substrate.

29. The plasma processing system as recited in claim 28, wherein the control signal indicates a clamping force to be applied to the plasma chamber.

30. The plasma processing system as recited in claim 29, wherein the controller stores,one or more lookup tables, each lookup table associating rates of emissivity changes and a plurality of parameter values with one rate of emissivity change being associated with a set of parameter values, wherein the controller selects a set of parameter values associated with the determined rate of emissivity change and generates the control signal.

31. The plasma processing system as recited in claim 30, wherein the control signal is M(t) and wherein the controller generates the control s in accordance with an equation, $M(t)=Mc+Kp*E(t)+1/\Gamma i \int E(t)dt+\Gamma d*d\{E(t)\}/dt$, where Mc is a bias voltage of the electrostatic chuck, Kp is a proportional gain, $\Gamma i$ is an integral constant, $\Gamma d$ is a derivative constant, and E(t) is an error signal indicating a difference between the set-point temperature and the substrate temperature.

32. The plasma processing system as recited in claim 31, wherein the set of parameter values in the one or more lookup tables include values for Kp, $\Gamma i$, $\Gamma d$, and E(t).

33. The plasma processing system as recited in claim 23, the substrate is a wafer.

* * * * *